United States Patent
Inoue et al.

(10) Patent No.: US 6,630,986 B2
(45) Date of Patent: Oct. 7, 2003

(54) SCANNING TYPE EXPOSURE APPARATUS AND A DEVICE MANUFACTURING METHOD USING THE SAME

(75) Inventors: Mitsuru Inoue, Utsunomiya (JP); Hiroaki Takeishi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/324,647

(22) Filed: Jun. 3, 1999

(65) Prior Publication Data

US 2003/0128345 A1 Jul. 10, 2003

(30) Foreign Application Priority Data

Jun. 11, 1998 (JP) .......................................... 10-163457

(51) Int. Cl.[7] .......................... G03B 27/42; G03B 27/32; G05B 11/32
(52) U.S. Cl. .............................. 355/53; 355/77; 318/625
(58) Field of Search .............................. 355/53, 43, 45, 355/68, 77; 250/548; 356/399, 400, 401; 318/625, 560

(56) References Cited

U.S. PATENT DOCUMENTS

| | | |
|---|---|---|
| 5,040,431 A | 8/1991 | Sakino et al. |
| 5,685,232 A | 11/1997 | Inoue |
| 5,699,145 A * | 12/1997 | Makinouchi et al. .......... 355/53 |
| 5,757,149 A | 5/1998 | Sato et al. |
| 5,883,702 A * | 3/1999 | Tokunaga ...................... 355/53 |
| 5,900,707 A * | 5/1999 | Wakui .......................... 318/625 |
| 5,909,272 A | 6/1999 | Osanai et al. |
| 5,933,215 A | 8/1999 | Inoue et al. |
| 6,018,384 A * | 1/2000 | Ota .............................. 355/53 |
| 6,078,381 A * | 6/2000 | Suzuki ......................... 355/53 |
| 6,166,812 A * | 12/2000 | Ueda .......................... 356/401 |

* cited by examiner

Primary Examiner—Russell Adams
Assistant Examiner—Peter B. Kim
(74) Attorney, Agent, or Firm—Fitzpatrick, Cella, Harper & Scinto (57) ABSTRACT

A scanning type exposure apparatus includes a substrate stage for holding a substrate and for moving the substrate in at least one of a scanning direction and a rotational direction, an original stage for holding an original and for moving the original in at least one of the scanning direction and the rotational direction, an optical system for transferring a pattern of the original onto the substrate, and a controller for controlling movements of the substrate stage and the original stage. The controller synchronously controls the substrate stage and the original stage in the scanning direction, and independently controls the substrate stage and the original stage in the rotational direction.

40 Claims, 5 Drawing Sheets

SCANNING TYPE EXPOSURE APPARATUS AND A DEVICE MANUFACTURING METHOD USING THE SAME

BACKGROUND OF THE INVENTION

1. Field of the Invention

The present invention generally relates to a scanning type exposure apparatus and a device manufacturing method, wherein the exposure apparatus is preferably used in a lithography process for manufacturing micro-devices.

2. Description of the Related Art

In a lithography process for manufacturing micro-devices (e.g., semiconductors), two types of exposure apparatuses are known. One is a step-and-repeat type (so-called a stepper) and the other is a step-and-scan type (so-called a scanner or a scanning type exposure apparatus).

The former type uses a step-and-repeat sequence for transferring stepwise a pattern of an original (e.g., a reticle or a mask) onto a substrate (e.g., a semiconductor wafer or a glass or silicon substrate). In that sequence, the whole pattern of the original is illuminated and is projected onto one of a plurality of exposure regions on the substrate through a projection optical system, while the original and the substrate are maintained stationary. Next, the substrate is moved stepwise to change the exposure region, and then exposure is repeated in the same manner.

On the other hand, the latter type uses a step-and-scan sequence. In that sequence, an original pattern is illuminated with a slit-like beam and a portion of the pattern is projected onto one of a plurality of exposure regions on a substrate, while both the original and the substrate are scanningly moved. Next, the substrate is moved stepwise to change the exposure region, and then the exposure is repeated in the same manner.

The step-and-scan type exposure apparatus seems to have become the mainstream, at least for the near future, for the reason that it has a potential for high exposure performance in terms of an increase in transferring precision and field size.

The scanning type exposure apparatus includes stage devices (e.g., a wafer stage or a mask stage) for scanningly moving the wafer and the mask (reticle). While performing scanning exposure, the wafer stage and the mask stage are controlled synchronously by a master-slave control method. Generally, the wafer stage acts as the master stage and the mask stage as the slave stage, so that the mask stage follows the movement of the wafer stage in the scanning direction. The master-slave control method has an advantage of improving movement resolution, especially when the projection optical system is a reduced scale system.

In the conventional apparatus, however, there is a possibility of causing a relative deviation in all directions, except for the scanning direction, between the mask and the wafer. These directions include linear directions, i.e., the scanning direction (Y-direction) and directions (X-direction and Z-direction) perpendicular to the scanning direction, as well as rotational directions, each having X, Y, and Z rotational axes. In addition, the conventional apparatus does not have any mechanism to compensate for the deviation other than in the scanning direction. Therefore, it is difficult to increase pattern transferring accuracy of the scanning type exposure apparatus, and that makes it hard to manufacture a higher degree of integrated devices.

SUMMARY OF THE INVENTION

In view of above-described recognition about the prior art, a primary object of the present invention is to provide a scanning type exposure apparatus that is superior to the conventional apparatus.

In order to achieve the above object, the present invention, in a first aspect, provides a scanning type exposure apparatus including a substrate stage for holding a substrate and for moving the substrate in at least one of a scanning direction and a rotational direction, an original stage for holding an original and for moving the original in at least one of the scanning direction and the rotational direction, and a controller for controlling movements of the substrate stage and the original stage, wherein the controller synchronously controls the substrate stage and the original stage in the scanning direction, and independently controls the substrate stage and the original stage in the rotational direction.

Yet another object of the present invention is to provide an improved method for manufacturing micro-devices using the scanning type exposure apparatus.

In order to achieve the above object, the present invention, in another aspect, provides a device manufacturing method for manufacturing micro-devices, the method comprising holding a substrate with a substrate stage, moving the substrate, held on the substrate stage, in at least one of a scanning direction and a rotational direction, holding an original with an original stage, moving the original, held on the original stage, in at least one of the scanning direction, controlling, with a controller, movements of the substrate stage and the original stage, wherein the controller synchronously controls the substrate stage and the original stage in the scanning direction and independently controls the substrate stage and the original stage in the rotational direction, and transferring a pattern of the original onto the substrate, to manufacture microdevices.

These and other objects, features and advantages of the present invention will become more apparent from the following description of the preferred embodiments taken in conjunction with the accompanying drawings.

DESCRIPTION OF THE PREFERRED EMBODIMENTS

This invention will now be described in detail by way of example with reference to the accompanying drawings.

Figure 1:
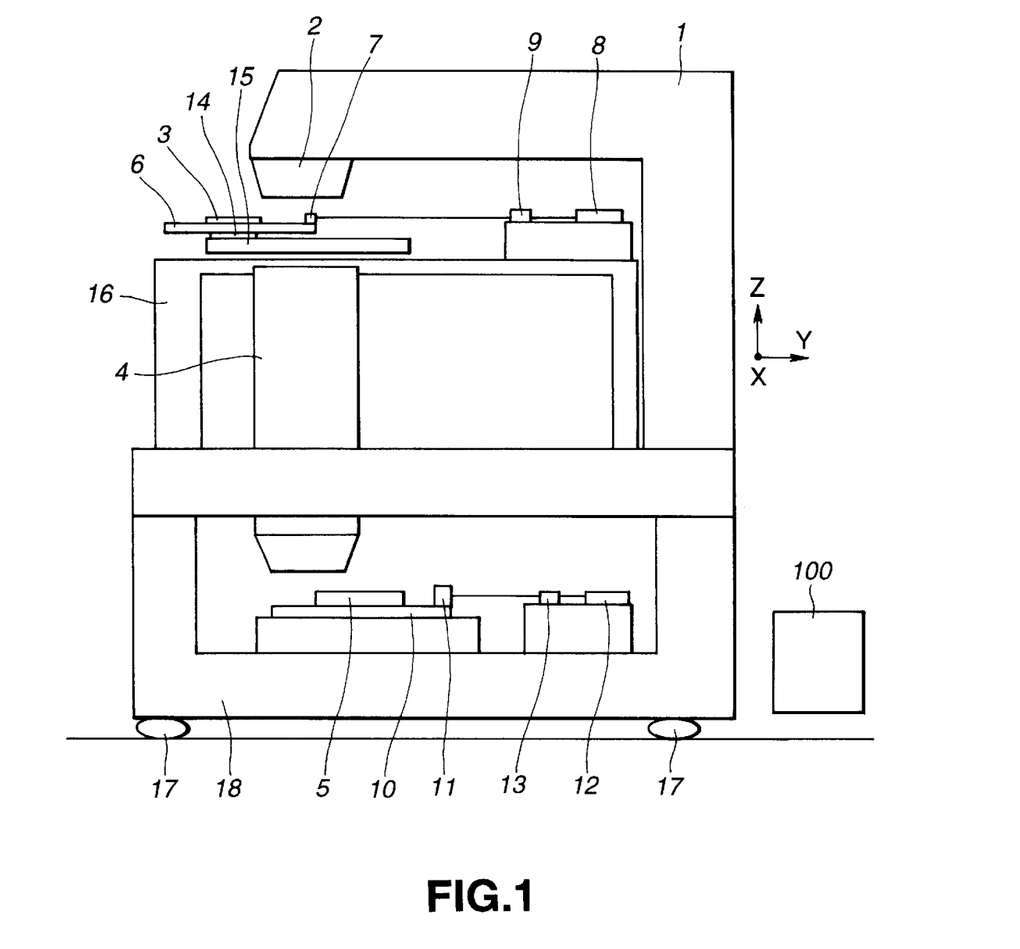
FIG. 1 is an exploded view of a step-and-scan type exposure apparatus including a stage device according to a first embodiment of the present invention.

FIG. 1 illustrates a structure of a step-and-scan type exposure apparatus according to an embodiment of the present invention. Referring to FIG. 1, an illumination optical system 1 illuminates a mask 3 with a slit beam. The slit beam is formed from a light source such as a mercury lamp or an excimer laser. The slit beam passes through a collimator lens 2 and irradiates the mask 3, having a mask pattern provided thereon. The irradiated mask pattern is projected onto a wafer 5 with a reduced scale (e.g., 4:1) by a projection optical system 4. The center of the slit beam is coincident with an optical axis of the projection optical system 4.

A mask stage 6, having a mask chuck, holds the mask 3 by vacuum adsorption. The mask stage 6 mounts a bar mirror 7 as a reflector. A mask measuring system, having a laser head 8 and a laser interferometer 9, measures the position of the mask stage 6 by using the mirror 7 mounted on the mask stage 6.

On the other hand, a wafer stage 10, having a wafer chuck, holds the wafer 5 by vacuum adsorption. The wafer stage 10 mounts a bar mirror 11 as a reflector. A wafer measuring system, having a laser head 12 and a laser interferometer 13, measures the position of the wafer stage by using the mirror 11 mounted on the wafer stage 10.

Further, an alignment detection system (not shown) for detecting the relative positional relation between the mask 3 and the wafer 5 is provided above the mask stage 6. A control system 100 controls the movement of the mask stage 6 and the wafer stage 10 in any direction. After an alignment operation, both stages are controlled by the control system 100 to scanningly move in the scanning direction in a predetermined speed ratio (e.g., 4:1) according to the reduced scale of the projection optical system 4.

The wafer stage 10 has a six-degree freedom of movement, consisting of the directions X, Y, Z, Wx, Wy, and Wz. In each of the X and Y directions, which are perpendicular to the optical axis of the projection optical system 4, the wafer stage 10 has a movement stroke sufficient to perform a step-movement or a scan-movement for any of the shot areas of the wafer 5. In the Z direction, which is parallel to the optical axis of the projection optical system 4, the wafer stage 10 has a movement stroke sufficient to perform both a focusing operation for properly arranging the focal plane of the projection optical system 4 with respect to one of the shot areas of the wafer, and a wafer-handling operation for allowing a robotic hand, for example, to load and remove the wafer 3 to and from the wafer stage 6. In the Wx and Wy directions, which are rotational directions about the X-axis and Y-axis, respectively, the wafer stage 10 has a minute movement stroke for tilting the wafers to adjust the wafer shot area relative to the focal plane. And, in the Wz direction, which is a rotational direction about the Z-axis, the wafer stage 10 has a movement stroke sufficient to orient the wafer using a reference (e.g., an orientation flat portion or a notch) formed on a rim of the wafer.

The mask stage 6 is movable on a stage guide 15 through static pressure bearings having a plurality of air-pads 14. The laser head 8, the laser interferometer 9 and the stage guide 15 are mounted on a frame structure 16 that is supported by a base frame 18, which is mounted on a floor through a plurality of anti-vibration units 17. The mask stage 6 has at least two linear motors on either side of it for moving the mask stage 6 in the linear direction of the Y-axis, while scanning exposure is performed. The mask stage 6 is able to move in the rotational direction (yawing) about the Z-axis by controlling the two linear motors such that they drive in different amounts. Also, the linear motors have a mechanism able to move by a minute amount in the X-direction, which is perpendicular to the scanning direction, and the mask stage 6 can also move in the linear direction of the X-axis. Further, each of the plurality of the air-pads 14 of the mask stage 6 is supported on the mask stage 6 through a piezo-electric element, and the mask stage 6 is able to move in the Z-direction (linear direction) and in the rotational directions (pitching and rolling) about the X-axis and the Y-axis.

Therefore, the mask stage 6 has a six-degree freedom of movement consisting of the directions X, Y, Z, Wx, Wy, and Wz. The present invention has adopted a linear motor as a non-contact type actuator. Nevertheless, other types of actuators, e.g., a ball-nut actuator, a cylinder, and the like can be chosen.

Figure 2:
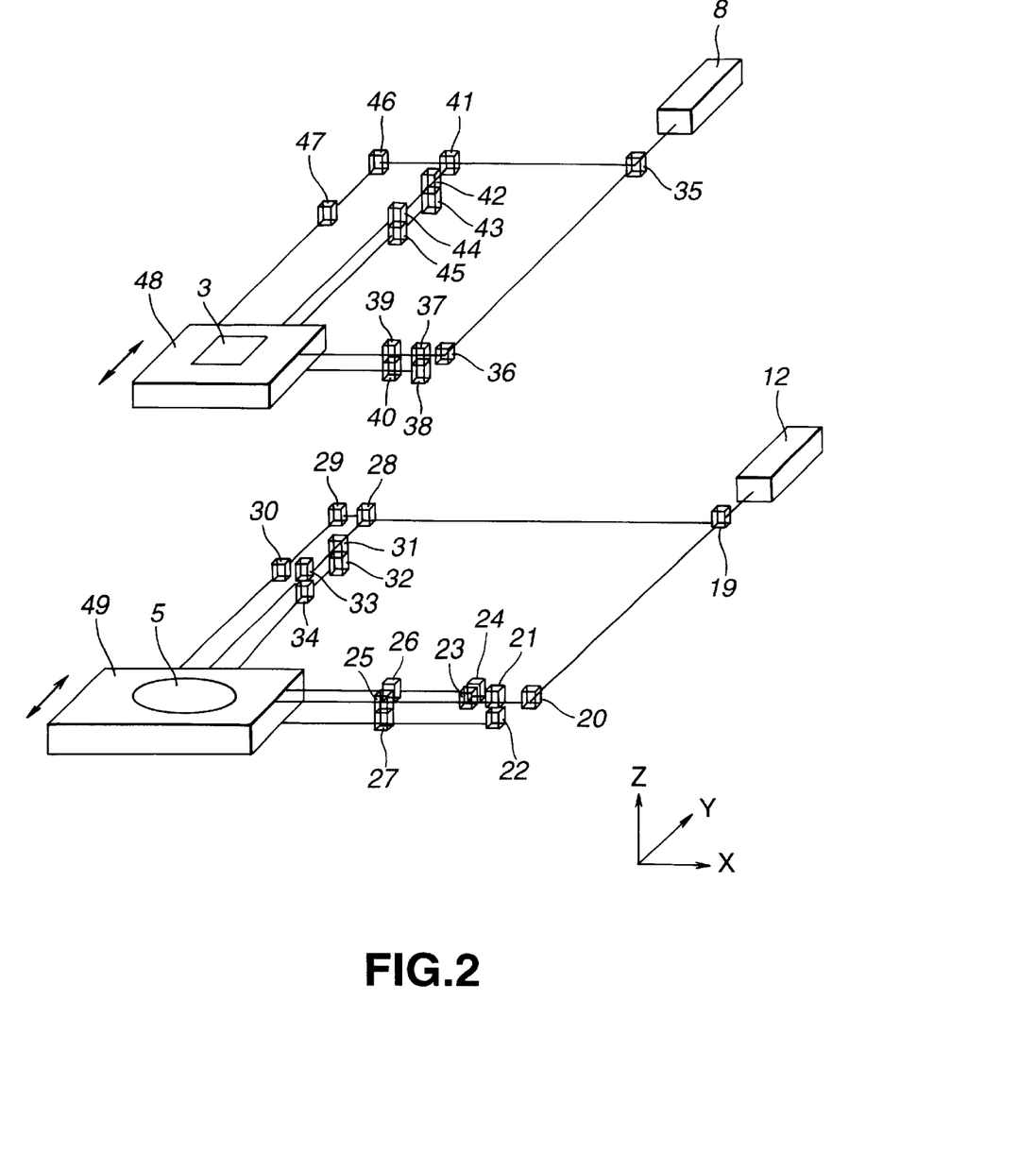
FIG. 2 is an elevational cross-sectional view of the stationary base of the stage device shown in FIG. 1.

FIG. 2 shows a schematic view of the optical arrangement of the measuring systems, including the laser heads and interferometers, for measuring positions of a mask stage and a wafer stage according to the present embodiment. A mask stage 48 shown in FIG. 2 is described in the abstract, but mask stage 48 would typically include the mask stage 6 and the bar mirror 7 shown in FIG. 1. Also, a wafer stage 49 shown in FIG. 2 would typically include the wafer stage 10 and the bar mirror 11 shown in FIG. 1.

The optical system comprises a plurality of optical elements 19, 21, 23, 28, 31, 35, 37, 41 and 42 for splitting the laser beams, and a plurality of optical elements 20, 22, 24, 29, 32, 36, 38, 43 and 46 for deflecting the laser beams. The optical system also comprises a plurality of interferometers for measuring positional information of the mask stage 48 or the wafer stage 49 in the X- or Y-directions.

As for the mask stage 48, the optical system comprises five interferometers 39, 40, 44, 45 and 47 for measuring actual positional information of the mask stage 48, except in the Z-direction (i.e., the direction of the optical axis of the projection optical system). The actual position of the mask stage 48 in the linear direction of the X-axis can be detected by the detection output of the interferometer 39, and in the linear direction of the Y-axis can be detected by the detection output of the interferometer 44. The actual positional information of the rotational direction about the X-axis (Wx) can be calculated by using the difference of the detection outputs (Y-direction) of the interferometers 44 and 45 and the span between the laser beams of the interferometers 44 and 45 in the Z-direction. The actual positional information of the rotational direction about the Y-axis (Wy) can be calculated by using the difference of the detection outputs (X-direction) of the interferometers 39 and 40 and the span between the laser beams of the interferometers 39 and 40 in the Z-direction. And, the actual positional information of the rotational direction about the Z-axis (Wz) can be calculated by using the difference of the detection outputs (Y-direction) of the interferometers 44 and 47 and the span between the laser beams of the interferometers 44 and 47 in the X-direction.

As for the wafer stage 49, the optical system comprises six interferometers 25, 26, 27, 30, 33 and 34 for measuring actual positional information of the wafer stage 49, except in the Z-direction (i.e., the direction of the optical axis of the projection optical system). The actual position of the wafer stage 49 in the linear direction of the X-axis can be detected by the detection output of the interferometer 25, and in the linear direction of the Y-axis can be detected by the detection output of the interferometer 33. The actual positional information of the rotational direction about the X-axis (Wx) can be calculated by using the difference of the detection outputs (Y-direction) of the interferometers 33 and 34 and the span between the laser beams of the interferometers 33 and 34 in the Z-direction. The actual positional information of the rotational direction about the Y-axis (Wy) can be calculated by using the difference of the detection outputs (X-direction) of the interferometers 25 and 27 and the span between the laser beams of the interferometers 25 and 27 in the Z-direction. And, the actual positional information of the rotational direction about the Z-axis (Wz) can be calculated two ways. One way is to calculate this information (Wz1) by using the difference of the detection outputs (X-direction) of the interferometers 25 and 26 and the span between the laser beams of the interferometers 25 and 26 in the X-direction. The other is to calculate this information (Wz2) by using the difference of the detection outputs (Y-direction) of the interferometers 33 and 30 and the span between the laser beams of the interferometers 33 and 30 in the X-direction.

The above-mentioned two ways to measure the rotational direction about the Z-axis (Wz) can be chosen by choosing means (not shown) in the control system 100, according to the operating state of the exposure apparatus. To be more specific, in a scanning exposure operation, the positional information of the wafer stage 49 in the rotational direction about the Z-axis is measured by the former way (Wz1) using the positional information in the X-direction, perpendicular to the scan direction. On the other hand, in a global alignment operation, the positional information of the wafer stage 49 in the scanning direction about the Z-axis is measured by the latter way (Wz2) using the positional information in the Y-direction (i.e., the scan direction). In other words, the choosing means chooses first yawing detecting means when a scanning operation is being performed, and chooses second yawing detecting means when a global alignment operation is being performed. As a result of this appropriate choice, it is possible to reduce the influence of the flatness of the mirror of the wafer stage 49, and to measure positional information precisely.

Figure 3:
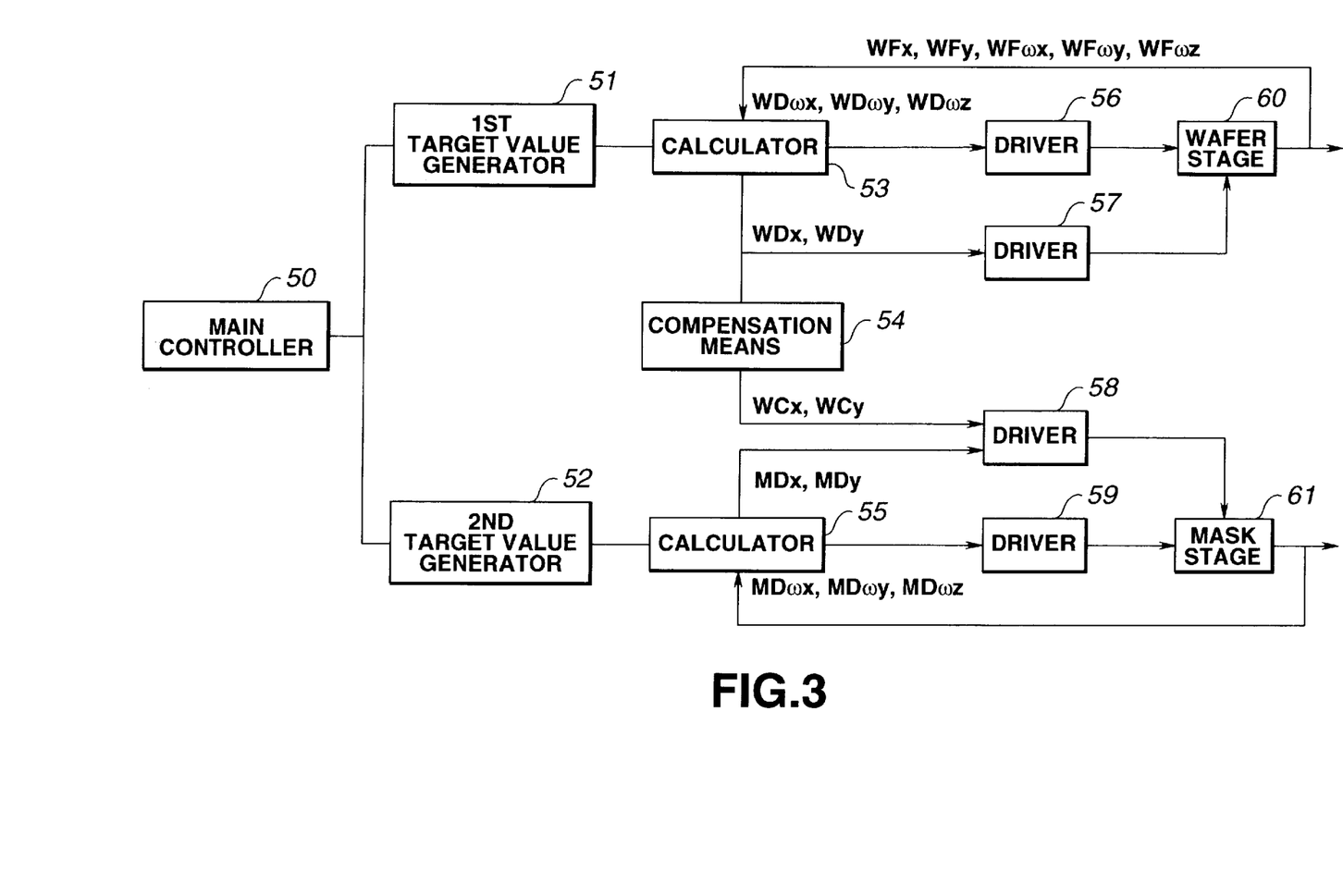
FIG. 3 is a schematic view of the movable units of the stage device shown in FIG. 1.

FIG. 3 shows a block diagram of the control-system for controlling a mask stage 61 and a wafer stage 60 according to the present embodiment. The drive axes of the mask stage 61 and the wafer stage 60 include linear directions, i.e., scanning directions (Wy, My) and directions (Wx, Mx) perpendicular to the scanning directions and an optical axis of a projection optical system, and rotational directions (Wwx, Wwy, Wwz, Mwx, Mwy, Mwz), each having X, Y, and Z rotational axes.

Main-controller 50 orders a first target value generator 51 and a second target value generator 52 to generate command signals. According to the command signals from the first target value generator 51, a first calculator 53 calculates driving signals (WDy, WDx) relating to the linear directions of the scanning direction (i.e., the Y-direction) and the direction (i.e., the X-direction) perpendicular to the scanning direction of the wafer stage 60. The first calculator 53 also calculates driving signals (WDwz, WDwx, WDwy) relating to the rotational directions of the yawing (wz), the pitching (wx) and the rolling (wy) of the wafer stage. A driver 56 for the rotational directions and a driver 57 for the linear directions drive each of the actuators in the wafer stage 60. The interferometers, as described above, measure actual positions and inclinations of the wafer stage 60 and the calculator 53 receives feedback signals (WFx, WFy, WFwx, WFwy, WFwz) as actual values from the interferometers. The calculator 53 calculates deviation signals (WDx, WDy, WDwx, WDwy, WDwz) as a difference between each of the target value signals and the feedback signals, and outputs the deviation signals to the drivers 56 and 57. The calculator 53 also outputs the deviation signals (WDx, WDy) relating to the linear directions to compensation means 54 for the master-slave synchronous controlling in the linear directions.

According to the command signals from the second target value generator 52, a calculator 55 calculates driving signals (MDy, MDx) relating to the linear directions of the scanning direction (i.e., the Y-direction) and the direction (i.e., the X-direction) perpendicular to the scanning direction of the mask stage 61. The first calculator 55 also calculates driving signals (MDwz, MDwx, MDwy) relating to the rotational directions of the yawing (wz), the pitching (wx) and the rolling (wy) of the mask stage. A driver 58 for the linear directions drives each of the liner motors of the mask stage 61 according to the outputs of the calculator 55 and the compensating signals from the compensation means 54, so as to perform the master-slave synchronous controlling. A driver 59 for the rotational directions drives each of the rotational actuators in the mask stage 61. The interferometers, as described above, measure actual positions and inclinations of the mask stage 61 and the calculator 55 receives feedback signals (RFx, RFy, RFwx, RFwy, RFwz) as actual values from the interferometers. The calculator 55 calculates deviation signals (RDx, RDy, RDwx, RDwy, RDwz) as a difference between each of the target value signals and the feedback signals, and outputs the deviation signals to the drivers 58 and 59.

The compensation means 54 includes a phase compensator, an amplifier and a filter, and receives the deviation signals relating to the linear directions (i.e., the X- and Y-directions). For driving the mask stage 61 (slave) according to the wafer stage 60 (master) movement in the linear directions as the master-slave synchronous controlling, the controlling elements 54 generate the compensation signals (WCx, WCy) for the mask stage 61 based on the deviation signals (WDx, WDy) of the wafer stage 60. A filter in the compensation means 54 cuts a predetermined range of frequency components of the deviation signals (WDx, WDy) that might cause a natural oscillation of the mask stage. The driver 58 drives the mask stage 61 in the linear directions according to the sum of the outputs of the calculator 55 and the compensating signals from the compensation means 54.

Signals are processed at the calculators 53, 55, the drivers 56 to 59 and the compensation means 54, in digital processing, in order to obtain precise, high-speed and stabilized controlling. The calculators 55, 55 perform a coordinates calculation and the drivers 56 to 59 perform calculations for each axis.

According to the above-mentioned embodiment, the main controller 50 synchronously controls the mask stage 61 and the wafer stage 60 in the scanning direction, and independently controls the mask stage 61 and the wafer stage 60 in the rotational direction. In other words, in the linear directions (the X- and Y-directions), the controller 50 controls the mask stage 60 according to the deviations of the wafer stage 61 with the master-slave synchronous controlling method while scanning exposure is performed, so as to reduce relative deviation between the mask and the wafer. In contrast, in the rotational directions (the yawing, the pitching and the rolling), the controller 50 controls the mask stage 61 and the wafer stage 60 independently, so as to reduce deviations of each of the mask and the wafer in the yawing, the pitching and the rolling directions, without complex calculations being required.

The wafer stage 60 and the mask stage 61 are driven such that a pattern of the acceleration versus time has a trapezoidal shape, and after reaching the scanning speed, the wafer stage 60 and the mask stage 61 spend a settling time for synchronous settling, and then scanning movement is performed.

In the above-described reduction scale exposure apparatus, the mask stage 61 is controlled to follow the movement of the wafer stage 60 in the linear directions. Since the scanning distance of the mask stage 61 is larger than that of the wafer stage 60, depending on the reduced scale of the projection, the movement resolution of the mask stage 61 becomes relatively high in the linear directions.

If the control system controls the wafer stage 60 and the mask stage 61 synchronously—not only in the linear direction, especially in the scanning direction—but also in the rotational directions, an enormous calculation, i.e., an excessive load on the calculators or a relatively long calculation time, is required. And, this disturbs the improvement of the control ability. Especially, in the rotational directions relative to the linear directions, a complicated calculation is required, including converting angle information to position information, for rotationally moving the stage without affecting other directions. In the rotational directions, it is not expected to improve the movement resolution, as compared with that in the linear directions. According to the present embodiment, by controlling movements of the first stage and the second stage independently, without using the master-slave synchronous controlling method in the rotational direction, it is possible to reduce the calculations and obtain high-response controlling. Therefore, it is easy to improve the stage performance and the scanning exposure performance.

One of the features of the present invention is that the controller synchronously controls the first and the second stages in the scanning (linear) direction and independently controls the first and the second stages in the rotational direction. For that purpose, the present embodiment shows an example of a master-slave synchronous controlling method with the wafer stage as a master and the mask stage as a slave. In more detail, the present embodiment shows that the compensation signals in the linear directions of the wafer stage, through the compensation means, are applied to the driver of the mask stage. But, another solution, with the mask stage as a master and the wafer stage as a slave, can be selected. That is, the wafer stage is driven to compensate for the relative deviation of the mask stage and the wafer stage in the linear directions (at least in the scanning direction).

In the present embodiment, since the mask stage is driven with six degrees of freedom, including three rotational directions (yawing, pitching and rolling), it is possible to omit the drive of the pitching (Mwx) and rolling (Mwy) directions of the mask stage, for the reason that the yawing (Mwz) deviation is most effective in the pattern transfer accuracy, whereas the pitching and the rolling deviations have little affect.

Also, it is possible to apply the master-slave synchronous controlling method in the linear vertical direction (the Z-direction).

Figure 4:
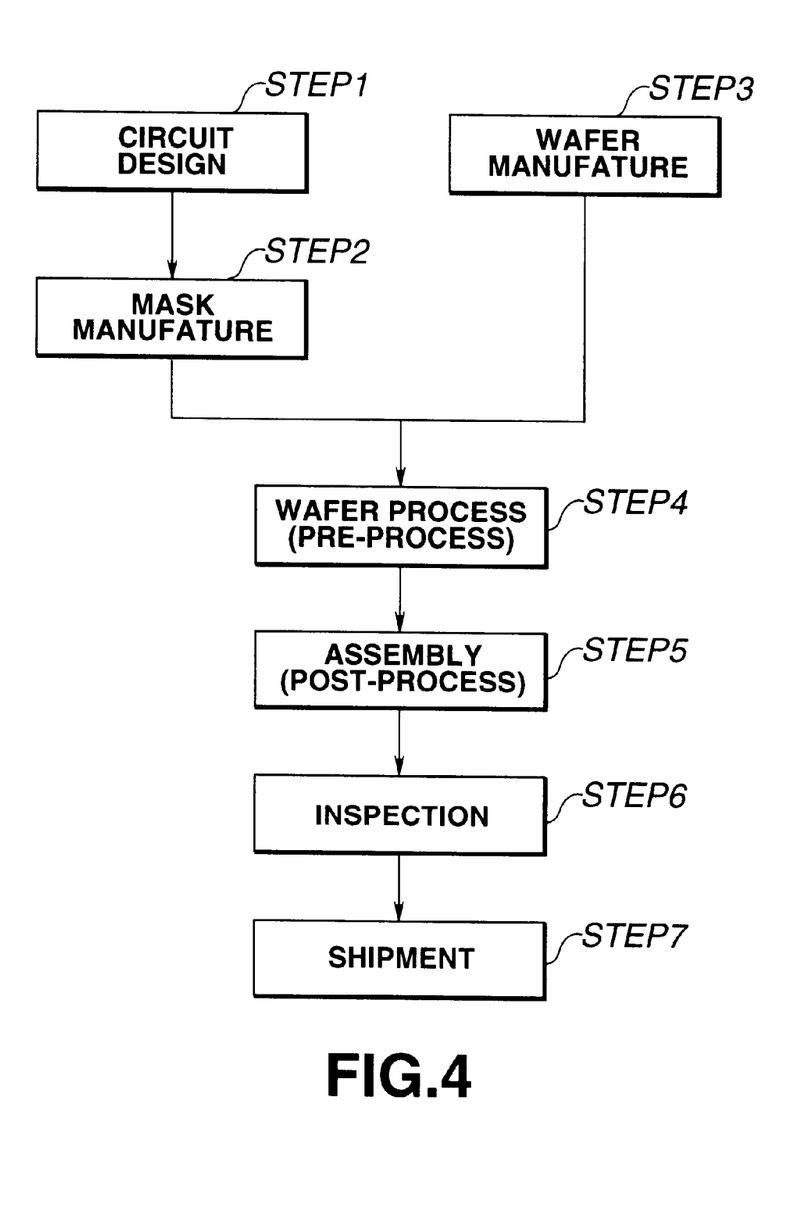
FIG. 4 is a flowchart showing a process for manufacturing a micro-device.

FIG. 4 is a flow chart showing a process for manufacturing a micro-device (e.g., a semiconductor chip such as an IC or an LSI, a liquid crystal panel, a CCD, a thin film magnetic head, a micro-machine or the like). At step 1 (circuit design), the circuit design of the semiconductor device is effected. At step 2 (the manufacturing of a mask), a mask formed with the designed circuit pattern is manufactured. This mask is a reflection type mask and has the above-described feature. On the other hand, at step 3 (the manufacturing of a wafer), a wafer is manufactured by the use of a material such as silicon. Step 4 (wafer process) is called a pre-process, in which by the use of the manufactured mask and wafer, an actual circuit is formed on the wafer by lithography techniques. The next step, step 5 (assembling) is called a post-process, which is a process for making the wafer manufactured at step 4 into a semiconductor chip, and includes steps such as an assembling step (dicing and bonding) and a packaging step (enclosing the chip). At step 6 (inspection), inspections such as an operation confirming test and a durability test of the semiconductor device manufactured at step 5 are carried out. Via such steps, the semiconductor device is completed, and it is delivered (step 7).

Figure 5:
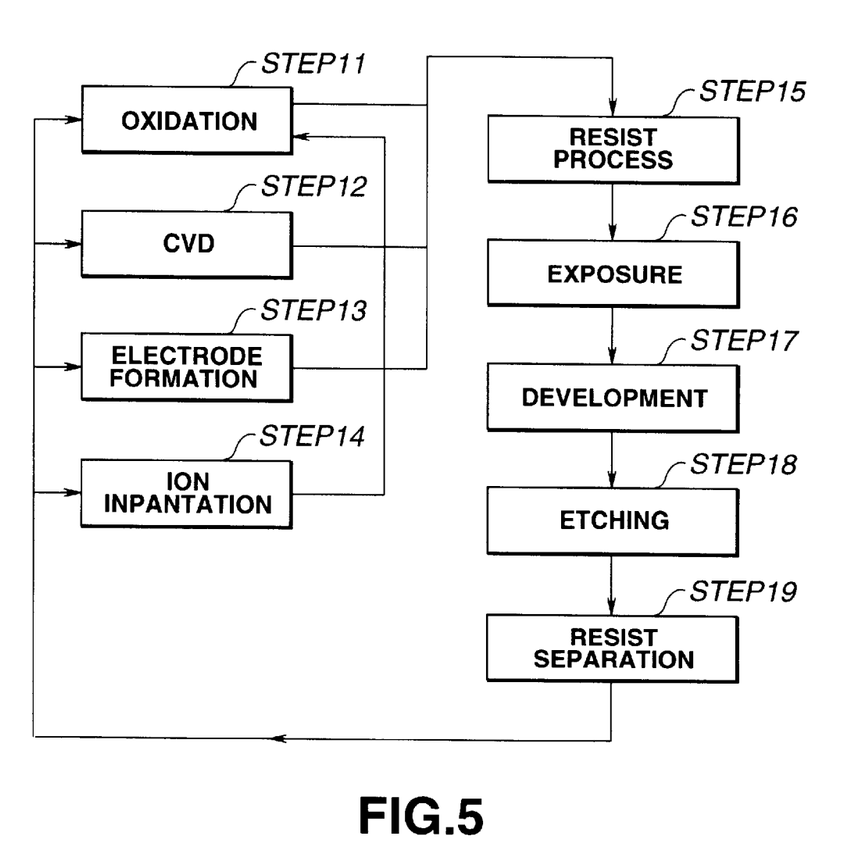
FIG. 5 is a flow chart showing the detailed steps of the wafer process in the micro-device manufacturing process shown in FIG. 4.

FIG. 5 is a flow chart showing the detailed steps of the wafer process discussed above with respect to step 4 in FIG. 4. At step 11 (oxidation), the surface of the wafer is oxidized. At step 12 (chemical vapor deposition-CVD), an insulating film is formed on the surface of the wafer. At step 13 (the forming of an electrode), an electrode is formed on the wafer by vapor deposition. At step 14 (ion implantation), ions are implanted into the wafer. At step 15 (resist processing), a photoresist is applied to the wafer. At step 16 (exposure), the circuit pattern of the mask is printed and exposed onto the wafer by the mask and the exposure apparatus. At step 17 (development), the exposed wafer is developed. At step 18 (etching), the portions other than the developed resist image are scraped off. At step 19 (the peeling-off of the resist), the resist, which has become unnecessary after the etching, is removed. By repetitively carrying out these steps, circuit patterns are multiply formed on the wafer. If the manufacturing method of the present embodiment is used, it will be possible to manufacture semiconductor devices of a high degree of integration which have heretofore been difficult to manufacture.

Except as otherwise disclosed herein, the various components shown in outline or in block form in the figures are individually well known and their internal construction and operation is not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A scanning type exposure apparatus, comprising:
   a substrate stage for holding a substrate and for moving the substrate in a scanning direction and at least one substrate stage rotational direction;
   an original stage for holding an original, the original having a pattern thereon, and for moving the original in the scanning direction and at least one original stage rotational direction; and
   a controller for controlling movements of said substrate stage and said original stage, wherein during a scanning exposure of the substrate said controller controls driving of a scanning direction driver of said original stage synchronously with the driving of a scanning direction driver of the substrate stage, while controlling driving of a rotational movement driver of said substrate stage in the at least one substrate stage rotational direction and driving of a rotational movement driver of said original stage in the at least one original stage rotational direction during the scanning exposure independently of the synchronously controlled driving of the scanning direction drivers of the substrate stage and the original stage in the scanning direction, wherein said controller controls the rotational movement driver of said substrate stage independently of the rotational movement driver of said original stage.

2. An apparatus according to claim 1, wherein the at least one substrate stage rotational direction comprises at least one of a yawing, pitching, and rolling direction relative to the scanning direction, and the at least one original stage rotational direction comprises at least one of a yawing, pitching, and rolling direction relative to the scanning direction.

3. An apparatus according to claim 1, wherein the at least one original stage rotational direction and the at least one substrate stage rotational direction each comprises a rotational axis substantially parallel to an optical axis of an optical system.

4. An apparatus according to claim 3, wherein said controller comprises means for independently setting target values of said substrate stage and said original stage.

5. An apparatus according to claim 3, wherein the rotational axis is coincident with the optical axis of an optical system.

6. An apparatus according to claim 1, wherein the scanning direction is perpendicular to an optical axis of an optical system.

7. An apparatus according to claim 1, wherein said controller further synchronously controls said substrate stage and said original stage in a linear direction, perpendicular to the scanning direction.

8. An apparatus according to claim 1, wherein said controller performs synchronous control by a master-slave synchronous controlling method in the scanning direction.

9. An apparatus according to claim 8, wherein said controller comprises means for controlling said substrate stage as a master stage and said original stage as a slave stage, and said original stage is controlled to follow the movement of said substrate stage.

10. An apparatus according to claim 9, wherein said controller controls scanning movement of said original stage based on a deviation between an actual value and a target value of said substrate stage, while scanning is performed.

11. An apparatus according to claim 10, wherein said controller comprises compensating means for compensating for a deviation signal of said substrate stage and for providing a compensated signal to a driver of said original stage.

12. An apparatus according to claim 11, wherein said compensating means comprises a filter that cuts a predetermined range of frequency.

13. An apparatus according to claim 1, further comprising an optical system, said optical system comprising a reduction scale projection optical system.

14. An apparatus according to claim 1, wherein at least one of said substrate stage and said original stage can move in a direction perpendicular to the scanning direction.

15. An apparatus according to claim 1, further comprising measuring means for measuring positional information of said substrate stage and said original stage in the scanning direction and in the substrate stage and original stage rotational directions.

16. An apparatus according to claim 15, wherein said measuring means comprises a laser interferometer.

17. An apparatus according to claim 15, wherein said measuring means comprises a plurality of detection means for detecting yawing information of said substrate stage.

18. An apparatus according to claim 17, wherein said plurality of detection means comprises first yawing detection means for measuring a position of said substrate stage at least two positions in a direction along the scanning direction, and second yawing detection means for measuring a position of said substrate stage at least two positions in a direction perpendicular to the scanning direction and with respect to an optical axis of an optical system.

19. An apparatus according to claim 18, further comprising choosing means for choosing one of the first yawing detection means and the second yawing detection means according to an operating state of said exposure apparatus.

20. An apparatus according to claim 19, wherein said choosing means chooses said first yawing detection means when a scanning operation is performed, and chooses said second yawing detection means when a global alignment operation is performed.

21. A device manufacturing method for manufacturing micro-devices, said method comprising the steps of:
holding a substrate with a substrate stage;
moving the substrate held on the substrate stage in a scanning direction and at least one substrate stage rotational direction;
holding an original with an original stage;
moving the original held on the original stage in the scanning direction and at least one original stage rotational direction;
controlling, with a controller, movements of the substrate stage and the original stage, wherein during a scanning exposure of the substrate the controller controls driving of a scanning direction driver of the original stage synchronously with the driving of a scanning direction driver of the substrate stage while controlling driving of a rotational movement driver of the substrate stage in the at least one substrate stage rotational direction and driving of a rotational movement driver of the original stage in the at least one original stage rotational direction during the scanning exposure independently of the synchronously controlled driving of the scanning direction drivers of the substrate stage and the original stage in the scanning direction; and
transferring a pattern of the original onto the substrate, to manufacture micro-devices,
wherein said controlling step controls the rotational movement driver of the substrate stage independently of the rotational movement driver of the original stage.

22. A device manufacturing method according to claim 21, wherein the at least one substrate stage rotational direction comprises at least one of a yawing, pitching, and rolling direction relative to the scanning direction, and the at least one original stage rotational direction comprises at least one of a yawing, pitching, and rolling direction relative to the scanning direction.

23. A device manufacturing method according to claim 21, wherein the at least one original stage rotational direction and the at least one substrate stage rotational direction each comprises a rotational axis substantially parallel to an optical axis of an optical system.

24. A device manufacturing method according to claim 23, further comprising setting, by the controller, target values of the substrate stage and the original stage independently.

25. A device manufacturing method according to claim 23, wherein the rotational axis is coincident with the optical axis of the optical system.

26. A device manufacturing method according to claim 21, wherein the scanning direction is perpendicular to an optical axis of an optical system.

27. A device manufacturing method according to claim 21, further comprising synchronously controlling, with the controller, the substrate stage and the original stage in a linear direction perpendicular to the scanning direction.

28. A device manufacturing method according to claim 21, wherein the controller performs synchronous control by a master-slave synchronous controlling method in the scanning direction.

29. A device manufacturing method according to claim 28, further comprising controlling, by the controller, the substrate stage as a master stage and the original stage as a slave stage, such that the original stage is controlled to follow the movement of the substrate stage.

30. A device manufacturing method according to claim 29, further comprising controlling, by the controller, scanning movement of the original stage based on a deviation between an actual value and a target value of the substrate stage, while scanning is performed.

31. A device manufacturing method according to claim 30, further comprising compensating, by the controller, a deviation signal of the substrate stage and providing a compensated signal to a driver of the original stage.

32. A device manufacturing method according to claim 31, wherein the controller includes a compensating means including a filter that cuts a predetermined range of frequency.

33. A device manufacturing method according to claim 21, wherein said transferring step comprises using a reduction scale projection optical system to transfer the pattern of the original.

34. A device manufacturing method according to claim 21, wherein at least one of the substrate stage and the original stage can move in a direction perpendicular to the scanning direction.

35. A device manufacturing method according to claim 21, further comprising measuring, by measuring means, positional information of the substrate stage and the original stage in the scanning direction and in the substrate stage and original stage rotational directions.

36. A device manufacturing method according to claim 35, wherein the measuring means includes a laser interferometer.

37. A device manufacturing method according to claim 35, wherein the measuring means includes a plurality of yawing detection means for detecting yawing information of the first stage.

38. A device manufacturing method according to claim 37, wherein the plurality of yawing detection means includes a first yawing detection means for measuring a position of the substrate stage at at least two positions in a direction of the scanning direction, and a second yawing detection means for measuring a position of the substrate stage at least two positions in a direction perpendicular to the scanning direction and with respect to an optical axis of an optical system.

39. A device manufacturing method according to claim 38, further comprising choosing, with choosing means, one of the first yawing detection means and the second yawing detection means according to an operating state.

40. A device manufacturing method according to claim 39, wherein the choosing means chooses the first yawing detection means when a scanning operation is performed, and chooses the second yawing detection means when a global alignment operation is performed.

* * * * *

UNITED STATES PATENT AND TRADEMARK OFFICE
CERTIFICATE OF CORRECTION

PATENT NO. : 6,630,986 B2
DATED : October 7, 2003
INVENTOR(S) : Mitsuru Inoue et al.

It is certified that error appears in the above-identified patent and that said Letters Patent is hereby corrected as shown below:

<u>Drawings</u>,
Sheet 4, Figure 4, in "*STEP2*," "MANUFATURE" should read -- MANUFACTURE --;
and in "*STEP3*," "MANUFATURE" should read -- MANUFACTURE --.
Sheet 5, Figure 5, in "*STEP14*," "INPANTATION" should read -- IMPLANTATION --.

<u>Column 6</u>,
Line 37, "calculators 55," should read -- calculators 53, --.

Signed and Sealed this

Sixth Day of April, 2004

JON W. DUDAS
*Acting Director of the United States Patent and Trademark Office*